United States Patent [19]

Baskett et al.

[11] Patent Number: 4,716,547

[45] Date of Patent: Dec. 29, 1987

[54] CURRENT SWITCH FOR PROGRAMMING VERTICAL FUSES OF A READ ONLY MEMORY

[75] Inventors: Ira E. Baskett, Tempe, Ariz.; Gene T. Sluss, Chippewa Falls, Wis.

[73] Assignee: Motorola, Inc., Schaumburg, Ill.

[21] Appl. No.: 849,089

[22] Filed: Apr. 7, 1986

[51] Int. Cl.⁴ .............................................. G11C 11/40
[52] U.S. Cl. ...................... 365/96; 365/189; 307/530
[58] Field of Search .................. 365/96, 189, 195; 307/530

[56] References Cited

U.S. PATENT DOCUMENTS 4,646,264  2/1987  Matsuzaki ........................ 365/96

Primary Examiner—Terrell W. Fears
Attorney, Agent, or Firm—William E. Koch

[57] ABSTRACT

A ROM having an on-chip current switch is provided that removes the programming voltage from the vertical fuse of the ROM when the fuse is programmed, thereby preventing excessive current from flowing therethrough. A programming current switch is coupled between an output terminal and a row decode for switchable transmitting a programming voltage from the output terminal to the row decode, a word line and a fuse, wherein the programming voltage will program the fuse causing the voltage thereacross to change. A program sense amplifier is coupled between the row decode and the programming current switch for switching the programming current switch off when the voltage change has been sensed.

24 Claims, 5 Drawing Figures

CURRENT SWITCH FOR PROGRAMMING VERTICAL FUSES OF A READ ONLY MEMORY

FIELD OF THE INVENTION

This invention relates in general to Read Only Memories (ROMs) and, more particularly, to a ROM having an on-chip current switch that removes the programming voltage from the vertical fuse of the ROM when the fuse is programmed, thereby preventing excessive current from flowing therethrough.

BACKGROUND OF THE INVENTION

ROMs conventionally comprise a plurality of lateral or vertical fuses wherein a predetermined number of fuses are located in a row coupled to a word line and another predetermined number of fuses are located in a column coupled to a bit line. In other words, each fuse is uniquely coupled in a combination of columns and rows.

When a fuse is intact (electrically closed), it represents one digital state, i.e., "1". When the fuse is "blown" (electrically open), it represents a different digital state, i.e., "0". ROMs are manufactured with the fuses in the closed state and are subsequently programmed by applying a relatively high voltage between selected word lines and bit lines to open specific fuses.

Lateral fuses typically comprise a film of a material, i.e., nicrome, horizontally formed across a surface of the semiconductor chip. Vertical fuses typically comprise two back to back diodes having common anodes.

Lateral fuses when programmed with the high voltage will "blow open" and no residual programming current will flow thereafter. However, lateral fuses have a tendency to "grow back" over time in that "fingers" or extentions of the fuse material tend to permit current to flow therebetween when a sense voltage is applied between the word line and bit line.

A high voltage used to program a vertical fuse will short one of the back to back diodes and this shorted state will remain indefinitely. However, immediately after the diode is shorted and before the programming high voltage is removed, a high current continues to flow through the other diode. This high current easily may damage this other diode or melt the metalization of the word line or bit line.

One previously known method used to overcome this problem caused by the high current is to program the fuses with a current pulse and to read the state of the fuse with an off chip test system while programming in order to detect when the fuse is blown and then terminating the current pulse. Another previously known method uses a train of timed voltage pulses with periodic return to the verify mode to determine when the fuse has been programmed. However, these methods of programming require expensive electronic monitoring equipment that makes it financially unfeasable for the user of the ROM to do his own programming. Conventionally, the manufacturer of the ROM would program the ROM according to the customer's specifications. These methods cause increased inconvenience and time required to obtain a programmed ROM from the manufacturer than would be required if the user could program ROMs maintained in his own inventory.

Thus, what is needed is a ROM having an on-chip current switch that removes the programming voltage from the vertical fuse of the ROM when the fuse is programmed, thereby preventing excessive current from flowing therethrough.

SUMMARY OF THE INVENTION

Accordingly, it is an object of the present invention to provide an improved ROM.

Another object of the present invention is to provide a ROM having on chip circuitry that will remove the high programming voltage from the fuse substantially soon after the fuse has been programmed.

A further object of the present invention is to provide a ROM having on chip circuitry that will prevent damage to the ROM caused by high current through the fuse after the fuse has been programmed.

In carrying out the above and other objects of the invention in one form, there is provided a circuit for programming a plurality of vertical fuses of a read only memory, wherein each of the fuses are uniquely coupled between one of a plurality of word lines and one of a plurality of bit lines. A sense amplifier is coupled to one of the word lines by a row decode and to an output terminal by an output gate. A programming current switch is coupled between an output terminal and a row decode for switchable transmitting a programming voltage from the output terminal to the row decode, a word line and a fuse, wherein the programming voltage will program the fuse causing the voltage thereacross to change. A program sense amplifier is coupled between the row decode and the programming current switch for switching the programming current switch off when the voltage change has been sensed.

The above and other objects, features, and advantages of the present invention will be better understood from the following detailed description taken in conjunction with the accompanying drawings.

DETAILED DESCRIPTION OF THE INVENTION

Figure 1:
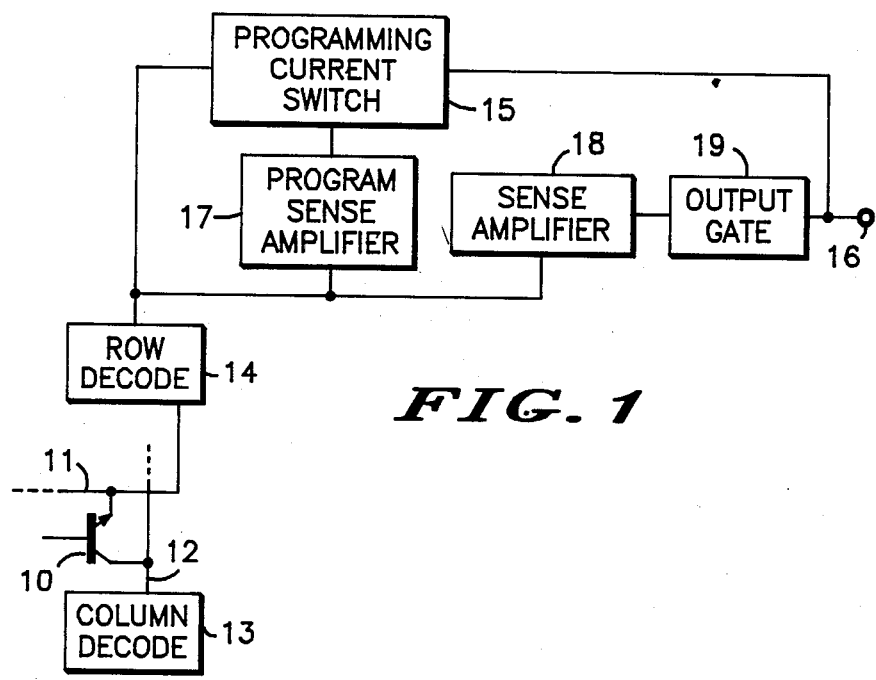
FIG. 1 is a block diagram of the present invention.

Referring to FIG. 1, a block diagram of the invention is shown which is suitable to be fabricated in monolithic integrated circuit form. Fuse 10 is schematically represented as a transistor having an emitter connected to word line 11, a collector connected to bit line 12, and a base that is floating. Effectively, fuse 10 is a pair of back to back diodes having their anodes connected together. Word line 11 and bit line 12 are only one each of a plurality of word lines and bit lines of a memory array, wherein one each of a plurality of fuses are uniquely coupled between each word line and bit line.

Word line 11 and bit line 12 are connected to column decode 13 and row decode 14, respectively, and function in relation thereto as in previously known ROMs in a manner well known to those skilled in the art. Programming current switch 15 is coupled between row decode 14 and output terminal 16 for switching on and off the programming voltage from output terminal 16 to row decode 14 and therefore fuse 10. Program sense amplifier 17 is coupled between row decode 14 and programming current switch 15 for triggering programming current switch 15 when fuse 10 is programmed. Sense amplifier 18 is connected to row decode 14 for sensing the voltage on word line 11 and output gate 19 is coupled between sense amplifier 18 and output terminal 16 for providing a logical output of a "1" or a "0" depending on the voltage sensed by sense amplifier 18.

In normal operation, programming current switch 15 and program sense amplifier 17 are not used. The ROM functions as in previously known ROMs in a manner well known to those skilled in the art, i.e., a voltage is applied to word line 11 and thusly to bit line 12 if fuse 10 is intact. Whether or not this voltage is supplied to bit line 12 is sensed by sense amplifier 18 and the result is provided to output gate 19 and output terminal 16.

In accordance with the present invention, to program fuse 10, a relative high voltage, i.e., 12 to 21 volts, is applied to output terminal 16 and thereby to programming current switch 15. This high voltage is transferred to row decode 14, word line 11 and fuse 10. Typically, about 6.0 to 8.0 volts will appear across fuse 10 and cause a collector-emitter breakdown and a subsequent voltage drop across fuse 10 to about 1.0 volts. This voltage drop across fuse 10 is sensed by program sense amplifier 17 and will in turn switch off programming current switch 15, thereby removing the high voltage from fuse 10. This high voltage on terminal 16 is blocked, i.e., by a diode within output gate 19 from flowing along that current path.

Figure 2:
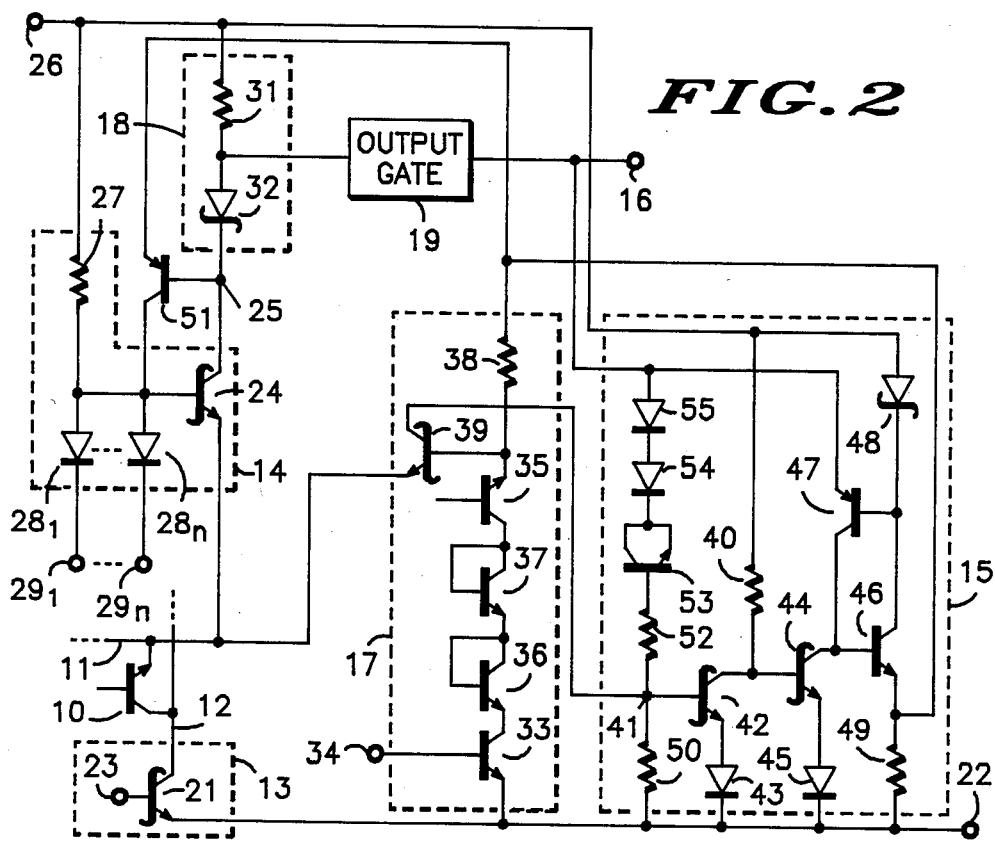
FIG. 2 is a partial schematic of one embodiment of the invention.

Referring to FIG. 2, column decode 13 comprises column driver transistor 21 having a collector connected to bit line 12, an emitter connnected to voltage terminal 22, and a base connected to terminal 23 for receiving a column decode signal. Column decode 13 provides for a method of selecting the desired column. Row decode 14 comprises NPN transistor 24 having a collector connected to node 25, an emitter connected to word line 11, and a base coupled to voltage terminal 26 by resistor 27. Voltage terminal 22 and 26 typically are coupled for receiving a supply voltage of ground and 5.0 volts, respectively. A plurality of diodes $28_1$–$28_n$ have an anode connected to the base of transistor 24 and a cathode connected, respectively, to a plurality of terminals $29_1$–$29_n$ for receiving a row decode signal on each of terminal $29_1$–$29_n$, where "n" may be any integer. Row decode 14 provides for a method of selecting the desired row. Sense amplifier 18 comprises resistor 31 coupled between voltage terminal 26 and output gate 19, and diode 32 having an anode connected to output gate 19 and a cathode connected to node 25. Sense amplifier 18 senses the voltage on word line 11 and provides the result as an output to output gate 19.

In the normal operating mode, the voltage across fuse 10 depends on whether it is "open" or "closed", the level of which is sensed at node 25 by sense amplifier 18 and provided as an output to output gate 19.

Program sense amplifier 17 comprises NPN transistor 33 having an emitter connected to voltage terminal 22, a base connected to terminal 34 for receiving a bias voltage, and a collector coupled to the collector of NPN transistor 35 by diodes 36 and 37. Transistor 35 has a base shorted to its emitter for duplicating the resistance of fuse 11 when fuse 11 is programmed, and an emitter connected to the base of transistor 39. Transistor 39 has an emitter connected to word line 11 and a collector connected to programming current switch 15 at node 41. Transistors 33, 35, 36 and 37 set the voltage level at the base of transistor 39. Whether transistor 39 conducts current is controlled by the voltage on word line 11 as explained further hereinafter.

Programming current switch 15 comprises Schotky transistor 42 having a base connected to node 41, an emitter coupled to voltage terminal 22 by diode 43 and a collector connected to the base of Schotky transistor 44 and coupled to voltage terminal 26 by resistor 40. Transistor 44 has an emitter coupled to voltage terminal 22 by diode 45 and a collector connected to the base of NPN transistor 46 and to the collector of PNP transistor 47. Transistor 46 has a collector connected to the base of transistor 47 and is coupled to voltage terminal 26 by diode 48, and an emitter coupled to voltage terminal 22 by resistor 49 and connected to the emitter of coupling PNP transistor 51 and to the base of transistor 39 by resistor 38. Transistors 46 and 47 function as an SCR who's operation depends on the voltage on terminal 16 and node 41. Transistor 51 has a base connected to node 25 and a collector connected to the base of transistor 24. Resistor 52 is coupled between node 41 and output terminal 16 by zener diode 53 and diodes 54 and 55. Resistor 50 is coupled between node 41 and voltage terminal 22.

In the programming mode, a high voltage, i.e., 12.0 to 21.0 volts, is applied to output terminal 16, turning on SCR 46, 47. The voltage therefrom is applied to transistor 51, transistor 24, word line 11 and fuse 10, in turn. The voltage appearing on word line 11 will keep transistor 39 off. When fuse 10 "blows", the voltage on word line 11 will drop, allowing transistor 39 to turn on. This turns off transistor 42, turns on transistor 44 and turns off SCR 46, 47, in turn, and removes the high voltage from fuse 10.

Figure 3:
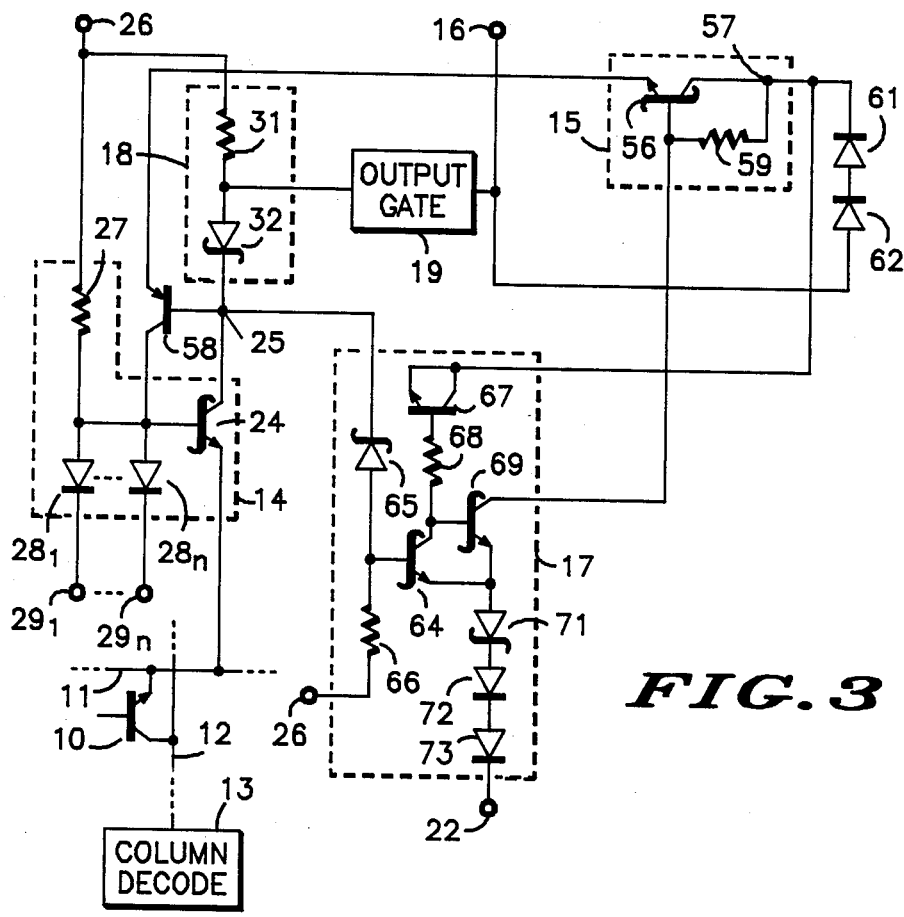
FIG. 3 is a partial schematic of a second embodiment of the invention.

Referring to FIG. 3, another embodiment is shown wherein fuse 10, column decode 13, row decode 14, sense amplifier 18, and output gate 19 are as described in FIG. 2. Programming current switch 15 comprises Schotky NPN transistor 56 having a collector connected to node 57, an emitter connected to the emitter of coupling transistor 58, and a base coupled to node 57 by resistor 59. Node 57 is coupled to output terminal 16 by diodes 61 and 62.

Program sense amplifier 17 comprises NPN transistor 64 having a base coupled to node 25 by diode 65 and to voltage terminal 26 by resistor 66, and a collector coupled to the base of zener transistor 67 by resistor 68. NPN transistor 69 has a base and an emitter connected to the collector and emitter of transistor 64, respectively, and a collector connected to the base of transistor 56. The emitter of transistor 69 is further coupled to voltage terminal 22 by diodes 71, 72, and 73. Transistor 67 has its collector and emitter connected to node 57.

In the programming mode, a high voltage applied to output terminal 16 will be transferred in turn to fuse 10 through transistor 56, transistor 58, transistor 24 and word line 11. When fuse 10 "blows" and the voltage on word line 11 drops, the voltage on node 25 will decrease causing transistor 64 to turn off and transistor 69 to turn on and 56 to turn off, thereby removing the high voltage from fuse 10.

Figure 4:
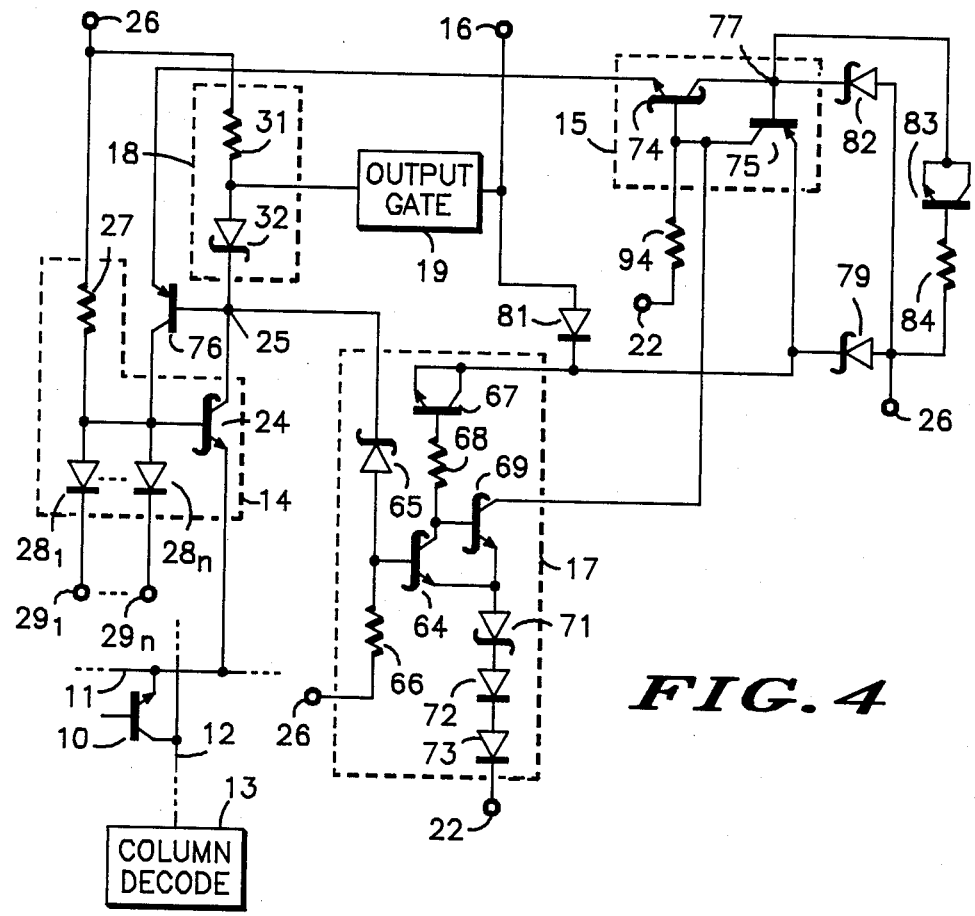
FIG. 4 is a partial schematic of a third embodiment of the invention.

Referring to FIG. 4, another embodiment is shown wherein fuse 10, column decode 13, row decode 14, program sense amplifier 17, sense amplifier 18, and output gate 19 are as described in FIG. 3. Programming current switch 15 comprises Schotky NPN transistor 74 and PNP transistor 75 connected to function as an SCR. Transistor 74 has an emitter connected to the emitter of coupling transistor 76, a collector connected to node 77, and a base connected to the collectors of transistors 69 and 75 and coupled to voltage terminal 22 by resistor 78. Transistor 75 has a base connected to node 77 and an emitter both coupled to voltage terminal 26 by diode 79 and to output terminal 16 by diode 81, and connected to the collector and emitter of zener transistor 67. Node 77 is coupled to voltage terminal 26 by diode 82 and is connected to the collector and emitter of zener transistor 83. The base of transistor 83 is coupled to voltage terminal 26 by resistor 84.

In the programming mode, a high voltage applied to output terminal 16 will be transferred in turn to fuse 10 through SCR 74, 75, transistor 76, transistor 24 and word line 11. When fuse 10 "blows" and the voltage on word line 11 drops, the voltage on node 25 will decrease causing transistor 64 to turn off and transistor 69 to turn on and SCR 74, 75 to turn off, thereby removing the high voltage from fuse 10.

Figure 5:
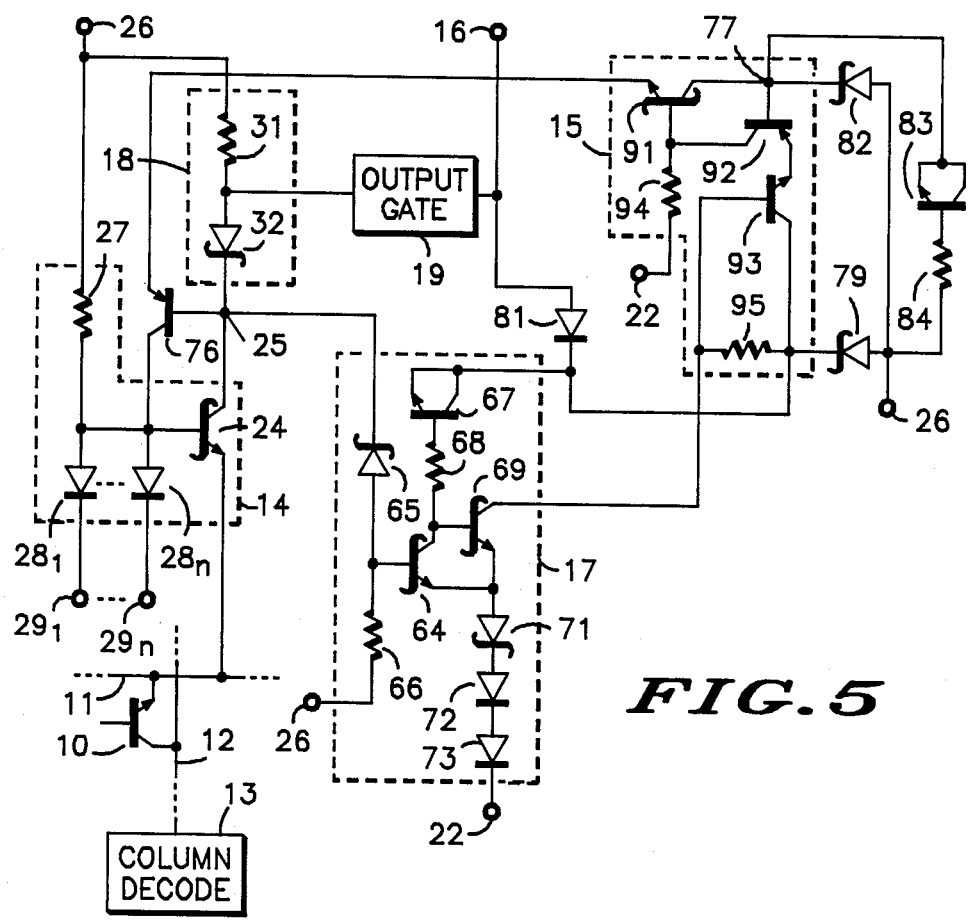
FIG. 5 is a partial schematic of a fourth embodiment of the invention.

Referring to FIG. 5, another embodiment is shown wherein fuse 10, column decode 13, row decode 14, program sense amplifier 17, sense amplifier 18, and output gate 19 are as described in FIG. 3. Programming current switch 15 comprises Schotky NPN transistor 91 and PNP transistor 92 coupled to function as an SCR, NPN transistor 93 and resistors 94 and 95. Transistor 91 has an emitter connected to the emitter of coupling transistor 76, a collector connected to the emitter of transistors 92 and 93, and a base connected to the collector of transistor 92 and coupled to voltage terminal 22 by resistor 94. The base of transistor 93 is coupled to its collector by resistor 95.

In the programming mode, a high voltage applied to output terminal 16 will be transferred in turn to fuse 10 through transistor 93, SCR 91, 92, transistor 76, transistor 24 and word line 11. When fuse 10 "blows" and the voltage on word line 11 drops, the voltage on node 25 will decrease causing transistor 64 to turn off and transistors 69 to turn on and 93 and SCR 91, 92 to turn off, thereby removing the high voltage from fuse 10.

By now it should be appreciated that there has been provided a ROM having an on-chip current switch that removes the programming voltage from the vertical fuse of the ROM when the fuse is programmed, thereby preventing excessive current from flowing therethrough.

We claim:

1. A current switch for programming a plurality of vertical fuses of a read only memory, said current switch and said read only memory both monolithically integrated on the same chip, each of said fuses uniquely coupled between one of a plurality of word lines and one of a plurality of bit lines, said read only memory including a row decode, a sense amplifier, an output gate, and an output terminal, said sense amplifier coupled to one of said word lines by said row decode and to said output terminal by said output gate, said current switch comprising:
   first means coupled between said output terminal and said row decode for switchably transmitting a programming voltage to said row decode from said output terminal, said programming voltage then being applied to said one of said word lines and one of said fuses, wherein said voltage will program said fuse an cause the voltage thereacross to change; and
   second means coupled between said row decode and said first means for switching said first means to prohibit said programming voltage from passing therethrough when said voltage change has been sensed.

2. The circuit according to claim 1 wherein said first means comprises:
   third means coupled between to said second means for providing a switching signal; and
   fourth means coupled between said output terminal and said third means and responsive to said switching signal for switchably transmitting said programming voltage.

3. The circuit according to claim 2 wherein said fourth means comprises an SCR having a gate coupled to said third means, an anode coupled to said output terminal, and a cathode coupled to a first voltage source.

4. The circuit according to claim 3 wherein said third means comprises:
   fifth means for providing a resistance; and
   a first transistor having a base coupled both to a second voltage source by said fifth means and to said second means, a collector coupled to said gate, and an emitter coupled to said first voltage source.

5. The circuit according to claim 4 wherein said third means further comprises:
   sixth means for providing a resistance; and
   a second transistor having a base coupled both to said output terminal by said sixth means and to said second means, a collector coupled to said base of said first transistor, and an emitter coupled to said first voltage source.

6. The circuit according to claim 1 wherein said second means comprises:
   third means coupled between said first means and said word line for sensing said voltage change; and
   fourth means coupled to said third means for biasing said third means.

7. The circuit according to claim 6 wherein said third means comprises a first transistor having a base coupled to said fourth means, a collector coupled to said first means, and an emitter coupled to said word line.

8. The circuit according to claim 1 wherein said first means comprises:
   third means for providing a resistance; and
   a first transistor having an emitter coupled to said row decode, a base coupled both to its collector by said third means and to said second means, and a collector coupled to said output terminal.

9. The circuit according to claim 8 wherein said second means comprises:
   fourth means for providing a resistance;
   fifth means for providing a resistance;
   a second transistor having a collector coupled to said base of said first transistor, an emitter coupled to a first voltage source, and a base coupled to said output terminal by said fourth means; and
   a third transistor having a collector coupled to said base of said second transistor, an emitter coupled to said emitter of said second transistor, and a base coupeld both to a second voltage source by said fifth means and to said row decoder.

10. The circuit according to claim 1 wherein said first means comprises an SCR having an anode coupled to said output terminal, a cathode coupled to said row decoder, and a gate coupled to said second voltage source.

11. The circuit according to claim 10 wherein said second means comprises:

third means for providing a resistance;
fourth means for providing a resistance;
a first transistor having a collector coupled to said first means, an emitter coupled to a first voltage source, and a base coupled to said output terminal by said third means; and
a second transistor having a collector coupled to base of said first transistor, an emitter coupled to said emitter of said first transistor, and a base coupled both to a second voltage source by said fourth means and to said row decoder.

12. The circuit according to claim 10 wherein said first means further comprises:
fifth means for providing a resistance; and
a third transistor having a collector coupled to second voltage terminal, to said output terminal, and to its base by said fifth means.

13. A programming circuit for programming a plurality of fuses of a programmable circuit, each of said fuses uniquely coupled between one of a plurality of row connectors and one of a plurality of column connectors, said programmable circuit including a row decode, a sense amplifier, and an output terminal, said sense amplifier coupled to one of said row connectors by said row decode and to said output terminal, said programming circuit comprising:
first means coupled between said output terminal and said row decode for switchably transmitting a programming voltage to said row decode from said output terminal, said programming voltage then being applied to said one of said row connectors and one of said fuses, wherein said voltage will program said fuse and cause the voltage thereacross to change; and
second means coupled between said row decode and said first means for switching said first means to prohibit said programming voltage from passing therethrough when said voltage change has been sensed.

14. The circuit according to claim 13 wherein said first means comprises:
third means coupled between to said second means for providing a switching signal; and
fourth means coupled between said output terminal and said third means and responsive to said switching signal for switchably transmitting said programming voltage.

15. The circuit according to claim 14 wherein said fourth means comprises an SCR having a gate coupled to said third means, an anode coupled to said output terminal, and a cathode coupled to a first voltage source.

16. The circuit according to claim 15 wherein said third means comprises:
fifth means for providing a resistance; and
a first transistor having a base coupled both to a second voltage source by said fifth means and to said second means, a collector coupled to said gate, and an emitter coupled to said first voltage source.

17. The circuit according to claim 16 wherein said third means further comprises:

sixth means for providing a resistance; and
a second transistor having a base coupled both to said output terminal by said sixth means and to said second means, a collector coupled to said base of said first transistor, and an emitter coupled to said first voltage source.

18. The circuit according to claim 13 wherein said second means comprises:
third means coupled between said first means and said row connector for sensing said voltage change; and
fourth means coupled to said seventh means for biasing said third means.

19. The circuit according to claim 18 wherein said third means comprises a first transistor having a base coupled to said fourth means, a collector coupled to said first means, and an emitter coupled to said word line.

20. The circuit according to claim 13 wherein said first means comprises:
third means for providing a resistance; and
a first transistor having an emitter coupled to said row decode, a base coupled both to its collector by said third means and to said second means, and a collector coupled to said output terminal.

21. The circuit according to claim 20 wherein said second means comprises:
fourth means for providing a resistance;
fifth means for providing a resistance;
a second transistor having a collector coupled to said base of said first transistor, an emitter coupled to a first voltage source, and a base coupled to said output terminal by said fourth means; and
a third transistor having a collector coupled to said base of said second transistor, an emitter coupled to said emitter of said second transistor, and a base coupled both to a second voltage source by said fifth means and to said row decoder.

22. The circuit according to claim 13 wherein said first means comprises an SCR having an anode coupled to said output terminal, a cathode coupled to said row decoder, and a gate coupled to said second voltage source.

23. The circuit according to claim 13 wherein said second means comprises:
third means for providing a resistance;
fourth means for providing a resistance;
a first transistor having a collector coupled to said first means, an emitter coupled to a first voltage source, and a base coupled to said output terminal by said third means; and
a second transistor having a collector coupled to said base of said first transistor, an emitter coupled to said emitter of said first transistor, and a base coupled both to a second voltage source by said fourth means and to said row decoder.

24. The circuit according to claim 22 wherein said first means further comprises:
fifth means for providing a resistance; and
a third transistor having a collector coupled to second voltage terminal, to said output terminal, and to its base by said fifth means.

* * * * *

UNITED STATES PATENT AND TRADEMARK OFFICE
CERTIFICATE OF CORRECTION

PATENT NO. : 4,716,547
DATED : Dec. 29, 1987
INVENTOR(S) : Ira E. Baskett

It is certified that error appears in the above-identified patent and that said Letters Patent is hereby corrected as shown below:

Column 8, claim 18, line 11, change "seventh" to --third--.

Signed and Sealed this

Twenty-ninth Day of November, 1988

Attest:

DONALD J. QUIGG

*Attesting Officer*   *Commissioner of Patents and Trademarks*